(12) United States Patent
Hung et al.

(10) Patent No.: US 6,653,183 B2
(45) Date of Patent: Nov. 25, 2003

(54) SINGLE-POLY EPROM AND METHOD FOR FORMING THE SAME

(75) Inventors: Chih-Wei Hung, Hsin-Chu (TW); Cheng-Yuan Hsu, Hsin-Chu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/269,602

(22) Filed: Oct. 11, 2002

(65) Prior Publication Data

US 2003/0203575 A1 Oct. 30, 2003

(30) Foreign Application Priority Data

Apr. 29, 2002 (TW) ........................................ 91108872 A

(51) Int. Cl.[7] .......................................... H01L 21/8242
(52) U.S. Cl. ........................ 438/211; 438/258; 438/266
(58) Field of Search ................................. 438/201, 211, 438/258, 264, 275, 279, 283

(56) References Cited

U.S. PATENT DOCUMENTS 5,364,806 A * 11/1994 Ma et al. ..................... 438/266
6,103,573 A * 8/2000 Harari et al. ................ 438/264
6,133,098 A * 10/2000 Ogura et al. ................ 438/267
6,146,945 A * 11/2000 Osanai ........................ 438/258
6,512,263 B1 * 1/2003 Yuan et al. .................. 438/211

* cited by examiner

Primary Examiner—Chandra Chaudhari
(74) Attorney, Agent, or Firm—Ladas & Parry

(57) ABSTRACT

A single-poly EPROM and method for forming the same. The single-poly EPROM has an isolation region disposed in a substrate to define a striped active area. A deep n-well is located under the isolation region and the striped active area. A gate oxide layer is disposed on the substrate at the striped active area. A pair of striped selective gates perpendicular to the striped active area are disposed on the gate oxide layer and the isolation region. A pair of islanded floating gates are disposed on the gate oxide layer at the active area, with a gap between the pair of floating gates and the pair of selective gates. A striped p-well is disposed in the deep n-well between the pair of selective gates and below the pair of selective gates and portions of the pair of floating gates. A pair of sources are disposed on both sides of the p-well, and connected to each other through the deep n-well. A drain is disposed in the p-well between the pair of selective gates.

7 Claims, 12 Drawing Sheets

SINGLE-POLY EPROM AND METHOD FOR FORMING THE SAME

BACKGROUND OF THE INVENTION

1. Field of the Invention

The present invention relates in general to an erasable programmable read-only memory (EPROM) and method of forming the same. In particular, the present invention relates to a method of fabricating a single-poly EPROM compatible with complementary metal oxide semiconductor (CMOS) process and structure of the same.

2. Description of the Related Art

A single-poly erasable programmable read-only memory (EPROM) cell is a non-volatile storage device fabricated using process steps fully compatible with conventional single-poly CMOS fabrication process steps. As a result, single-poly EPROM cells are often embedded in CMOS logic and mixed-signal circuits.

FIGS. 1A–1C show a series of views that illustrate a conventional single-poly EPROM cell 10. FIG. 1A shows a plan view of cell 10, FIG. 1B shows a cross-section taken along line 1B—1B of FIG. 1A, while FIG. 1C shows a cross-section taken along line 1C—1C of FIG. 1A.

As shown in FIGS. 1A–1C, EPROM cell 10 includes spaced-apart source and drain regions 14 and 16, respectively, formed in a p-type semiconductor material 12, such as a well or a substrate, and a channel region 118 defined between source and drain regions 14 and 16.

As further shown in FIGS. 1A–1C, cell 10 also includes an n-well 20 formed in p-type material 12, and a field oxide region FOX formed in p-type material 12 to isolate source region 14, drain region 16, and channel region 18 from n-well 20.

In addition, cell 10 further includes adjoining p+ and n+ contact regions 22 and 24, respectively, formed in n-well 20. Current generation cells also include a p-type lightly doped drain (PLDD) region 26, which adjoins p+ contact region 22.

Further, a control gate region 28 is defined between PLDD region 26 and the field oxide region FOX that isolates n-well 20 from source region 14, drain region 16, and channel region 18. In addition, a layer of gate oxide 30 is formed over channel region 18, a layer of control gate oxide 32 is formed over control gate region 28, and a floating gate 34 is formed over gate oxide layer 30, control gate oxide layer 32, and a portion of the field oxide region FOX.

However, a cell cannot be shrunk in this type of single-poly EPROM, thus its density cannot be enhanced.

SUMMARY OF THE INVENTION

It is an object of the present invention to provide a single-poly EPROM with higher cell density and a method for forming the same.

It is another object of the present invention to provide a single-poly EPROM in which a single-poly EPROM cell is programmed with source side injection, improving its programming efficiency.

According to one aspect of the present invention, a pair of single-poly EPROM cell in a substrate is provided. The structure comprises an isolation region disposed in the substrate to define a striped active area. A deep well of first conductive type is located under the isolation region and the striped active area. A gate oxide layer is disposed on the substrate at the striped active area. A pair of selective gates are disposed on the gate oxide layer and the isolation region, and the pair of selective gates are striped-sharp and perpendicular to the striped active area. A pair of floating gates are disposed on the gate oxide layer corresponding to the active area, with a gap between the pair of floating gates and the pair of selective gates. A well of second conductive type is disposed in the deep well of first conductive type between the pair of selective gates and below the pair of selective gates and portions of the pair of floating gates. A pair of sources are disposed on both sides of the well of second conductive type, and the pair of sources are connected to each other through the deep well of first conductive type. A drain is disposed in the well of second conductive type between the pair of selective gates.

A method for programming a memory cell of a single-poly EPROM is provided. For the above-mentioned structure of a pair of memory cells sharing a drain, the programming method comprises the step of applying programming bias voltages to a selected memory cell as follows. A first positive voltage of about 1.5–2 V is applied to the selective gate of the selected memory cell. A second positive voltage of about 10–12 V is applied to the pair of sources. The well of second conductive type, the drain, and the selective gate of the other unselected memory cell are all grounded. Thus, the programming bias voltages cause charge carriers source side injection (SSI) to accumulate in the floating gate of the selected memory cell.

A method for reading memory cell of a single-poly EPROM is provided. For the above-mentioned structure of a pair of memory cells sharing a drain, the reading method comprises the step of applying reading bias voltages to a selected memory cell as follows. A first positive voltage of Vcc is applied to the selective gate of the selected memory cell. A second positive voltage of about 2 V is applied to the drain. The selective gate of the other unselected,memory cell is grounded.

According to another aspect of the present invention, a method of fabricating a pair of single-poly EPROM cells, compatible with CMOS process is provided. A substrate having an isolation region therein to define a striped active area is provided. A deep well of first conductive type is formed under the isolation region and the striped active area. A gate oxide layer is formed on the striped active area. A conductive layer is formed on the gate oxide layer. The conductive layer is defined to form a pair of floating gates and a pair of selective gates, and a gap exists between the pair of floating gates and the pair of selective gates. The pair of selective gates are striped and perpendicular to the striped active area, and the pair of floating gates are islanded-shape. A well of second conductive type is formed in the deep well of first conductive type between the pair of selective gates and below the pair of selective gates and portions of the pair of floating gates. A pair of sources is formed, and the pair of sources are connected to each other through the deep well of first conductive type. A drain is formed in the well of second conductive type between the pair of selective gates.

According to an embodiment of the present invention, the method of forming the pair of floating gates and the pair of selective gates comprises: forming a mask layer on the conductive layer, the mask layer substantially having a pattern of the pair of floating gates and the pair of selective gates; forming a plurality of spacers on the side walls of the mask layer, wherein the width of the gap between the pair of floating gates and the pair of selective gates is controlled by the spacers; and etching the conductive layer using the mask layer the spacers as an etching mask.

BRIEF DESCRIPTION OF THE DRAWINGS

The present invention will become more fully understood from the detailed description given, hereinbelow and the accompanying drawings, given by way of illustration only and thus not intended to be limitative of the present invention.

FIG. 1A shows a plan view of cell 10, FIG. 1B shows a cross-section taken along line 1B—1B of FIG. 1A, while FIG. 1C shows a cross-section taken along line 1C—1C of FIG. 1A.

FIGS. 3A–9A are a series of cross sections taken along line A—A of FIG. 2 showing the manufacturing steps in fabricating a single-poly EPROM cell in accordance with the present invention.

FIGS. 3B–9B are a series of cross sections showing the peripheral circuit area of the single-poly EPROM chip.

FIG. 6C is a cross section taken along line C—C of FIG. 2.

DETAILED DESCRIPTION OF THE INVENTION

STRUCTURE OF SINGLE-POLY EPROM

Figure 1A:
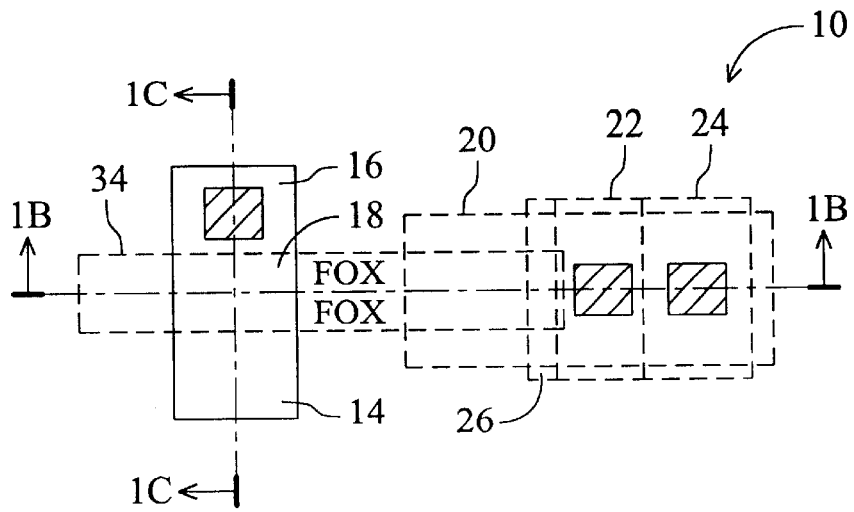
FIGS. 1A–1C show a series of views that illustrate a conventional single-poly EPROM cell 10.
Figure 1B:
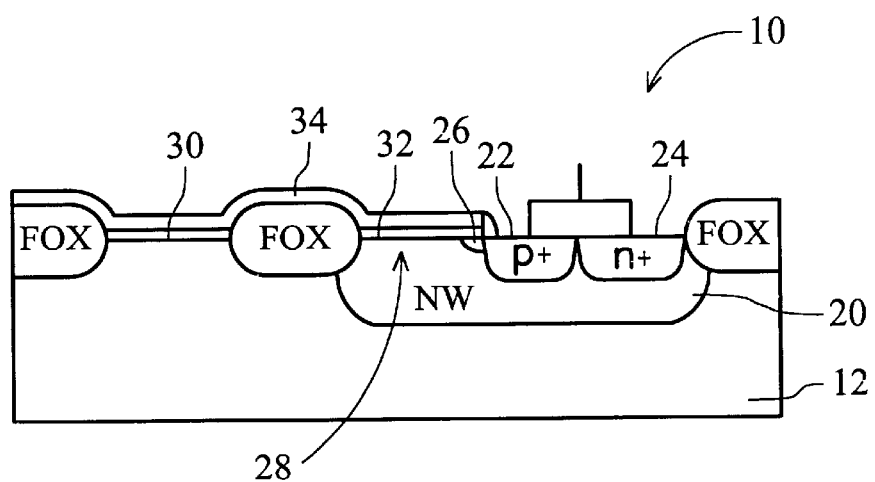
Figure 1C:
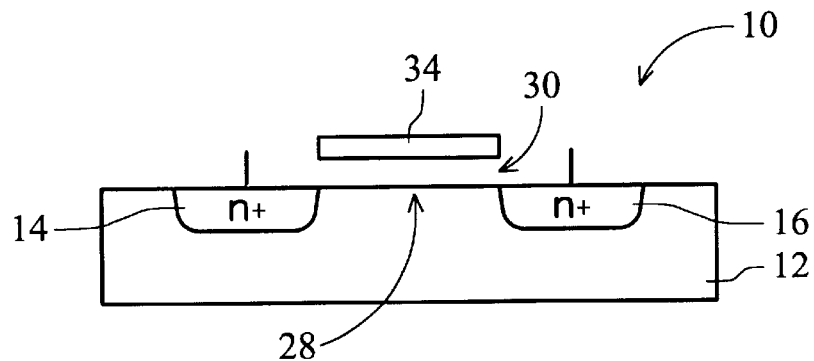
Figure 2:
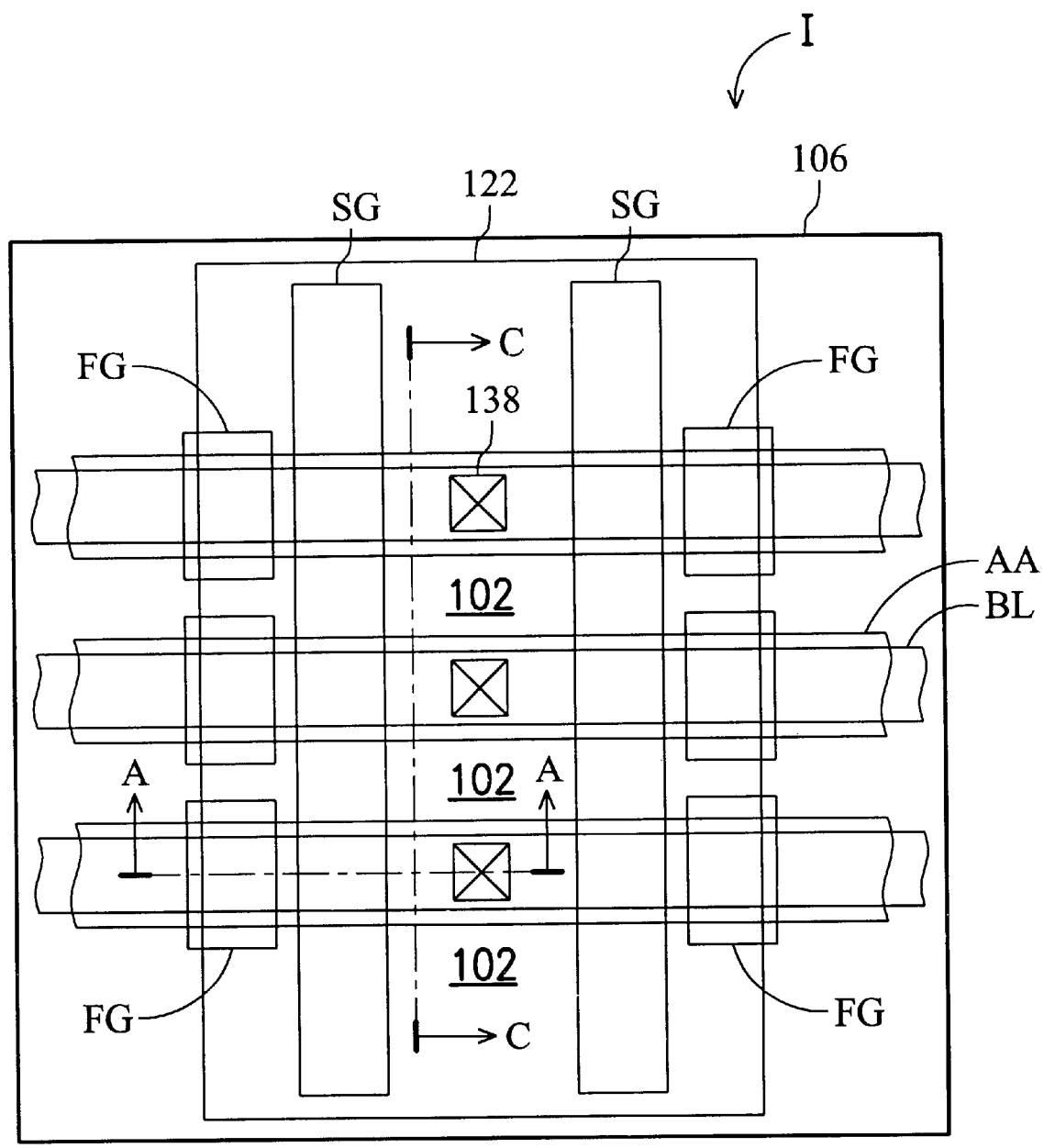
FIG. 2 shows a layout of single-poly EPROM cells in accordance with the present invention.
Figure 9A:
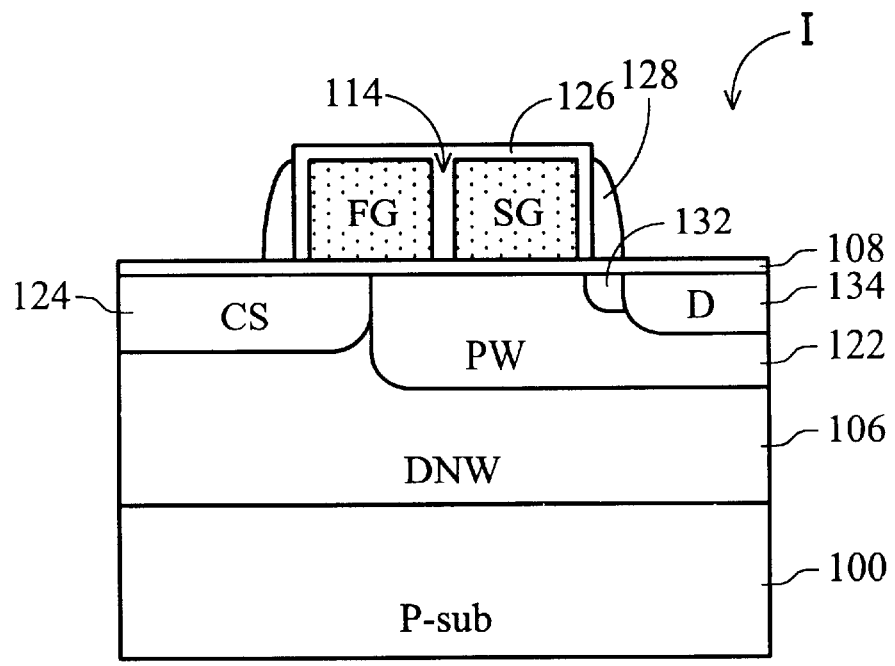

FIG. 2 shows a layout of single-poly EPROM cells sharing a striped well in accordance with the present invention. FIG. 9A is a cross section of a single-poly EPROM cell taken along line A—A of FIG. 2. A detailed description of the structure of the single-poly EPROM cells is given below.

As shown, an isolation region 102 is disposed in a substrate 100 to define striped active areas AA. The striped active areas AA are parallel to each other. A deep well of first conductive type 106 is located in the substrate 100 under the isolation region 102 and the striped active areas AA. A gate oxide layer 108 is disposed on the substrate 100 at the striped active areas AA. A pair of selective gates SG are disposed on the gate oxide layer 108 and the isolation region 102, and the pair of selective gates SG are striped and perpendicular to the striped active areas AA. Pairs of floating gates FG are disposed on the gate oxide layer 108 corresponding to the active area AA. A gap 114 exists between the pair of floating gates FG and the pair of selective gates SG. A well of second conductive type 122 is disposed in the deep well of first conductive type 106 below the pair of selective gates SG and portions of the pair of floating gates FG and between the pair of selective gates SG. Pairs of sources 124 are disposed on both sides of the well of second conductive type 122, and the pairs of sources 124 are connected to each other through the deep well of first conductive type 106. Drains 134 are disposed in the well of second conductive type 122 between the pair of selective gates SG. Each drain 134 is shared by two adjacent memory cells.

The above-mentioned pairs of sources 124 are laterally extended to half the width of the pairs of floating gates FG.

The above-mentioned deep well of first conductive type 106 can be a deep n-doped well (also called a deep n-well), and the above-mentioned well of second conductive type 122 can be a p-doped well (also called a p-well). As well, for a single-poly EPROM chip, many p-wells are disposed in the substrate 100 and parallel to each other. Each p-well can be regarded as a sector.

The above-mentioned isolation region 102 can be a field oxide layer or shallow trench isolation.

The material of the pairs of floating gates FG and the pair of selective gates SG is polysilicon.

A single-poly EPROM with higher density of memory cells is thus achieved according to the above-mentioned single-poly EPROM cells.

METHOD OF FABRICATING SINGLE-POLY EPROM

A single-poly EPROM chip includes a memory area and a peripheral circuit area. FIG. 2 shows a layout of single-poly EPROM cells sharing a striped well in the memory area in accordance with the present invention. FIGS. 3A–9A are a series of cross sections taken along line A—A of FIG. 2 showing the manufacturing steps in fabricating a single-poly EPROM cell in accordance with the present invention. FIGS. 3B–9B are a series of cross sections showing the peripheral circuit area of the single-poly EPROM chip. FIG. 6C is a cross section taken along line C—C of FIG. 2.

Figure 3A:
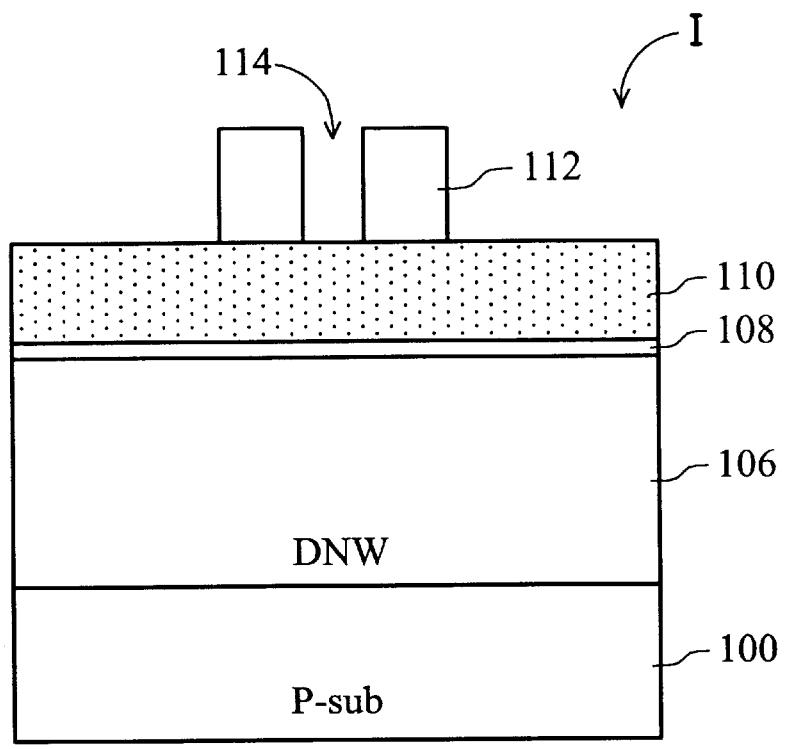
Figure 3B:
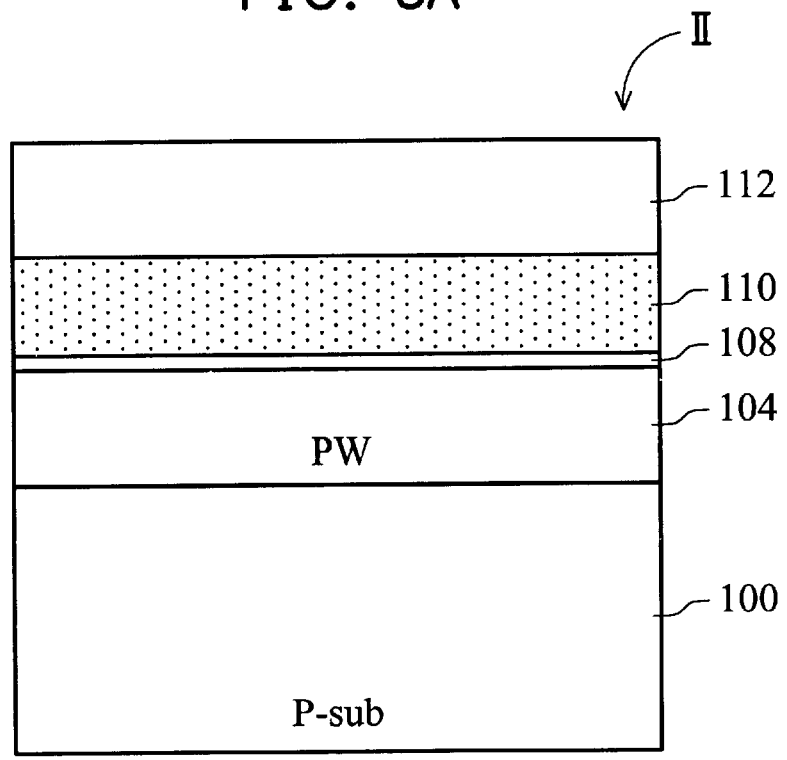

Referring to FIG. 2, FIG. 3A and FIG. 3B, a p-type semiconductor substrate (P-sub for short in figures) 100 is provided and can be divided into a memory area I and a peripheral circuit area II. An isolation region 102, such as a field oxide layer or shallow trench isolation, is formed in the substrate 100 to define striped active areas AA. The striped active areas AA are parallel to each other.

P-well and n-well are formed in the substrate 100 at the peripheral circuit area II. For simplicity, only p-well (PW for short in figures) 104 is shown. P-well 104 and n-well are formed by: forming a photoresist layer covering the n-well region on the substrate 100; implanting p-type dopants; removing the photoresist layer; forming another photoresist layer covering the p-well region on the substrate 100; implanting n-type dopants; and removing the photoresist layer.

A deep n-well (DNW for short in figures) 106 is formed in the substrate 100 at the memory area I. The deep n-well 106 is of: forming a photoresist layer exposing the memory area I on the substrate 100; implanting n-type dopants; and removing the photoresist layer. The implantation is performed by first implanting PH with a dosage of ~$10^{14}$ at about 1.2 MeV and then implanting PH with a dosage of $1 \times 10^{13}$ at about 700 KeV. The formed deep n-well 106 functions as a buried source line, and the buried source line has relatively low electric resistance.

The threshold voltage (Vt) of the floating gates FG in memory area I are then adjusted by: forming a photoresist layer exposing the memory area I on the substrate 100; implanting $PH_3$ with a dosage of about $10^{12}$ at about 180 KeV; and removing the photoresist layer. After implanting for threshold voltage, the threshold voltage (Vt) of the floating gates FG is changed to about −1~0 V.

Referring to FIGS. 3A and 3B, a gate oxide layer 108 with three thicknesses is formed on the substrate 100 at the active areas AA. For example, the gate oxide layer 108 at the peripheral circuit area II for logic devices is about 48 Å, the gate oxide layer 108 at the peripheral circuit area II for high voltage devices is about 200 Å, and the gate oxide layer 108 at the memory area I is about 90 Å.

A conductive layer 110, such as a polysilicon layer about 2000 Å, is deposited on the whole substrate 100 having the gate oxide layer 108 thereon. A mask layer 112, such as a silicon nitride layer, about 2000 Å, is formed on the conductive layer 110, and the mask layer 112 substantially has a pattern of floating gates and selective gates and a gap 114 between the two close side walls.

Figure 4A:
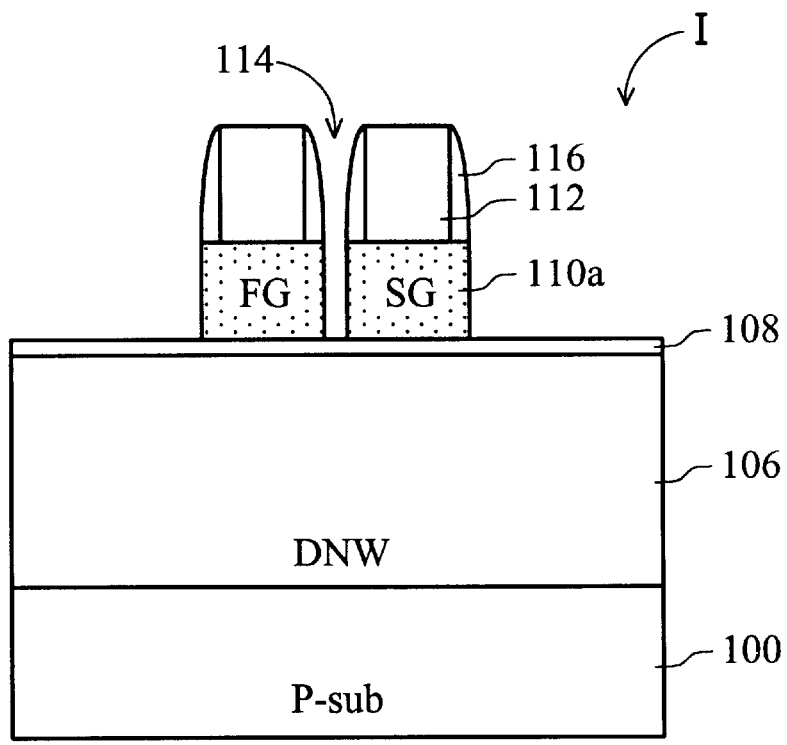
Figure 4B:
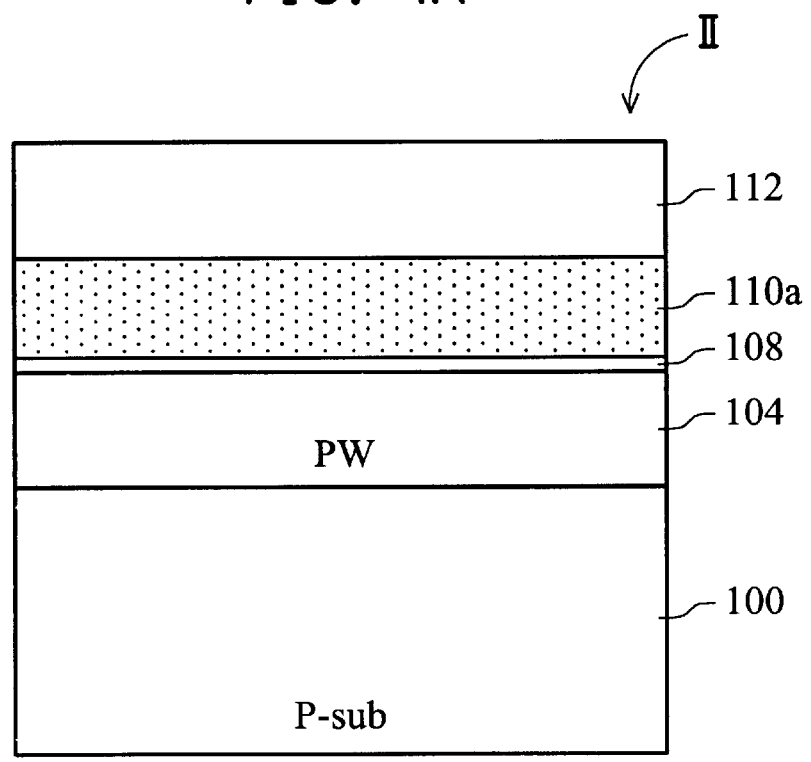

Referring to FIGS. 4A and 4B, spacers 116 are formed on the sidewalls of the mask layer 112 to shrink the width of the gap 114. The width of the gap 114, thus, can be controlled by the spacers 116. The spacers 116 are of the same material as the mask layer 112, such as silicon nitride. The spacers 116 are formed by: forming a conformal silicon nitride layer with about 500~1000 Å; and etching back until the surface of the conductive layer 110 is exposed.

The conductive layer 110 is then etched using the spacers 116 and the mask layer 112 as an etching mask to transfer to a patterned conductive layer 110a with a pair of striped selective gates SG and pairs of islanded floating gates FG. Channel regions are located under the selective gates SG and the floating gates FG.

Before removing the spacers 116 and the mask layer 112, a p-well process for memory region I is performed.

Referring to FIGS. 5A~6A, 5B~6B and 5C, a p-well 122 is formed between two adjacent selective gates SG and laterally extended under the two adjacent selective gates SG and parts of the floating gates FG, substantially corresponding to drains and the channel regions. The p-well 122 is striped and perpendicular to the striped active areas 104. Many p-wells are parallel to each other, formed in the substrate 100 and isolated from each other, although in the figures only one p-well 122 is shown.

The above-mentioned p-well 122 is of the following steps: forming a photoresist layer 130 with a pattern of p-well region on the mask layer, the spacers and the conductive layer; implanting p-type dopants in the deep n-well 106; removing the photoresist layer 130; thermally driving the dopants and merging together to form the striped p-well 122; and removing the mask layer 112 and the spacers 116.

After the above-mentioned thermal driving and merging process, the threshold voltage of the selective gates SG become about 0.8 V.

Ion implantation is performed by implanting B11 with a dosage of about $\sim 10^{13}/cm^2$ at about $\sim 100$ KeV. The implanted dopants are thermally driven and merged in nitrogen ($N_2$) atmosphere at 850° C. for about 30 minutes.

The spacers 116 and the mask layer 112 are removed by wet etching. The used etchant, as for silicon nitride being the material of the spacers 116 and the mask layer 112, is hot phosphoric acid.

After removing the spacers 116 and the mask layer 112, a CMOS gate process for peripheral circuit area II is carried out.

Figure 7A:
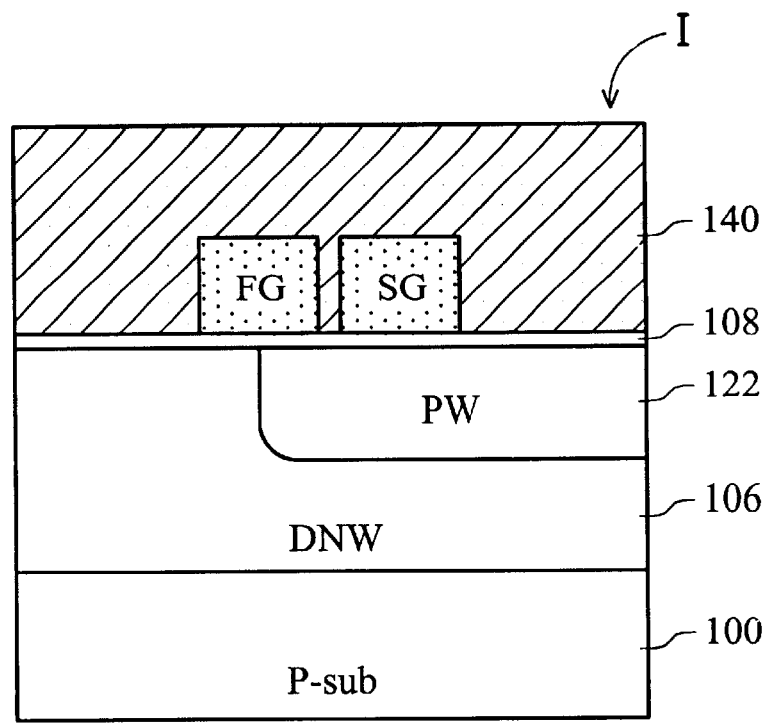
Figure 7B:
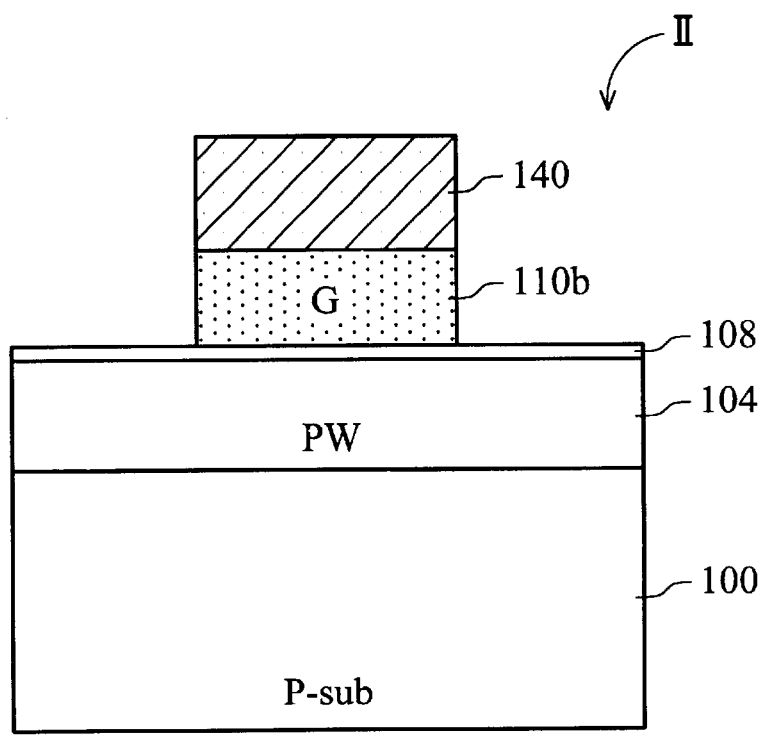
Figure 8A:
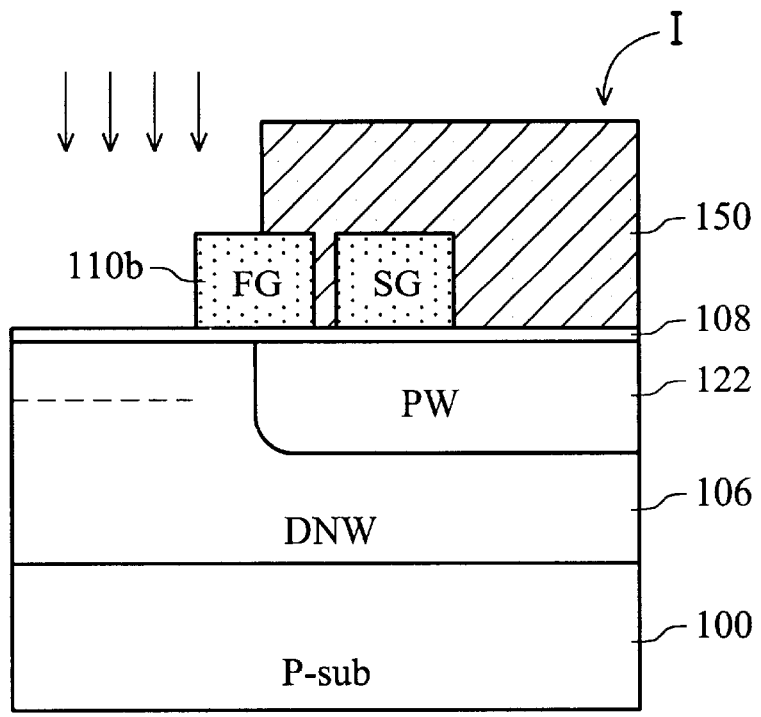
Figure 8B:
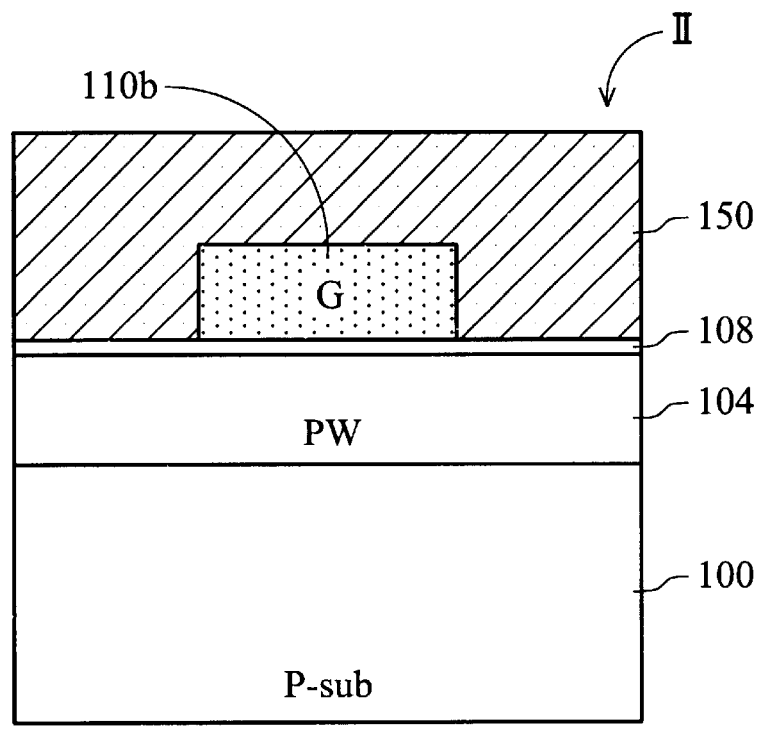

Referring to FIGS. 7A and 7B, a photoresist layer 140 with a pattern of gates for peripheral circuit area II is formed on the gate oxide layer 108, the patterned conductive layer 110a. The patterned conductive layer 110a is etched again using the photoresist layer 140 to transfer to a second-patterned conductive layer 110b with gate (G for short). The photoresist layer 140 is then removed. Thus, the second-patterned conductive layer 110b is constituted by the floating gates FG and the selective gates SG for memory area I and the gates G for peripheral circuit area II.

After finishing the CMOS gate process for peripheral circuit area II, a common source (CS for short) process for memory area is I is executed.

Referring to FIGS. 8A~9A and 8B~9B, a photoresist layer 150 is formed on the substrate 100 and the photoresist layer 150 has a pattern of source regions on both sides of the p-well 122. A pocket implantation is then performed by implanting n-type dopants.

The pocket implantation is executed by implanting PH at tilt angle of 30° with a dosage of about $5 \times 10^{13} \sim 1 \times 10^{14}/cm^2$ at about 50 KeV.

Figure 9B:
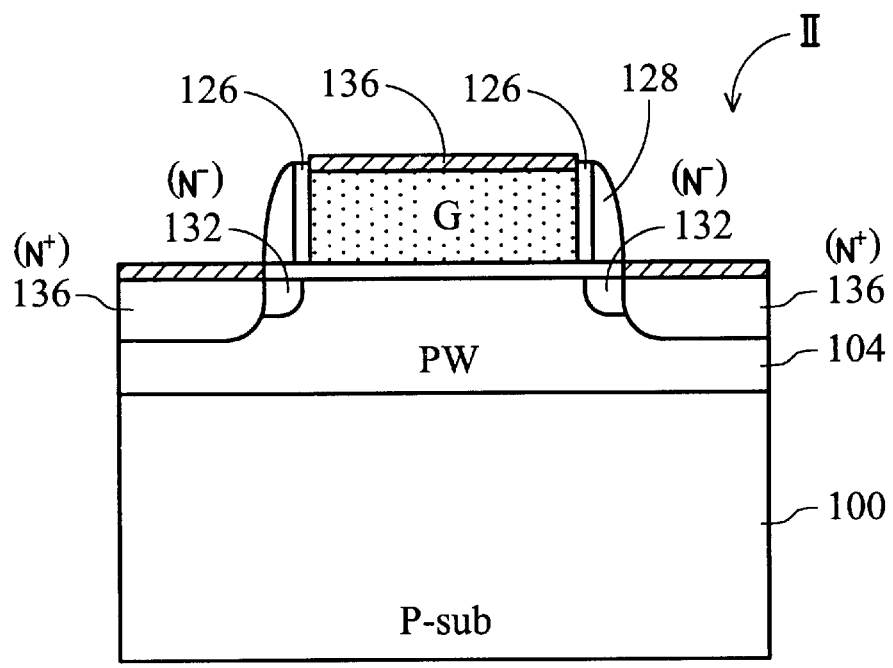

Referring to FIGS. 9A and 9B, after removing the photoresist layer 150, the implanted dopants are thermally driven, also referred to as re-oxidation. A dielectric layer 126, i.e. a silicon oxide layer, is also formed on the surface of the conductive layer 110b and fills the gap 114 between the two adjacent floating gates, FG and selective gate SG, at the same time.

The implanted n-type dopants are thermally driven in a dried oxygen ($O_2$) atmosphere at 850° C. to laterally diffuse under half the width of the floating gates FG to attain a higher coupling ratio between the source 124 and the floating gate FG.

A transistor process for peripheral circuit area II is executed. When forming sources/drains at peripheral circuit area II, sources/drains at memory area I are also formed.

Referring to FIGS. 9A and 9B, n⁻lightly doping (NLDD for short) and p⁻lightly doping (PLDD for short) are performed to form n⁻doped regions 132 and p⁻doped regions in p-well 104 and n-well respectively. Spacers 128 are then formed on both sides of gates G, one side of selective gates SG away from the floating gates FG and the other side of floating gates FG away from the selective gates SG. The material of the spacers 128 can be silicon nitride. The spacers 128 are formed by: forming a conformal silicon nitride layer of about 700 Å; and etching back.

N⁺heavy doping and p⁺heavy doping are performed to form n ⁺doped regions 134 and p ⁺doped regions in p-well 104 and n-well respectively. The n⁺heavy doping forms sources/drains of NMOS, for forming sources/drains at memory area I and for doping the polysilicon layer.

A self-aligned silicide (Salicide) layer 136 is formed on the surfaces of the gate G and sources/drains 134 at peripheral circuit area II.

As shown in FIG. 2, an inter-layer dielectric (ILD) layer is formed on the substrate 100. Contact plugs 138 are formed in the ILD layer and connect to the drains 134. A bit line or a first connection is formed on the ILD layer and connects with the contact plugs 138.

The backend processes proceed and descriptions are omitted.

OPERATION METHOD

Figure 10:
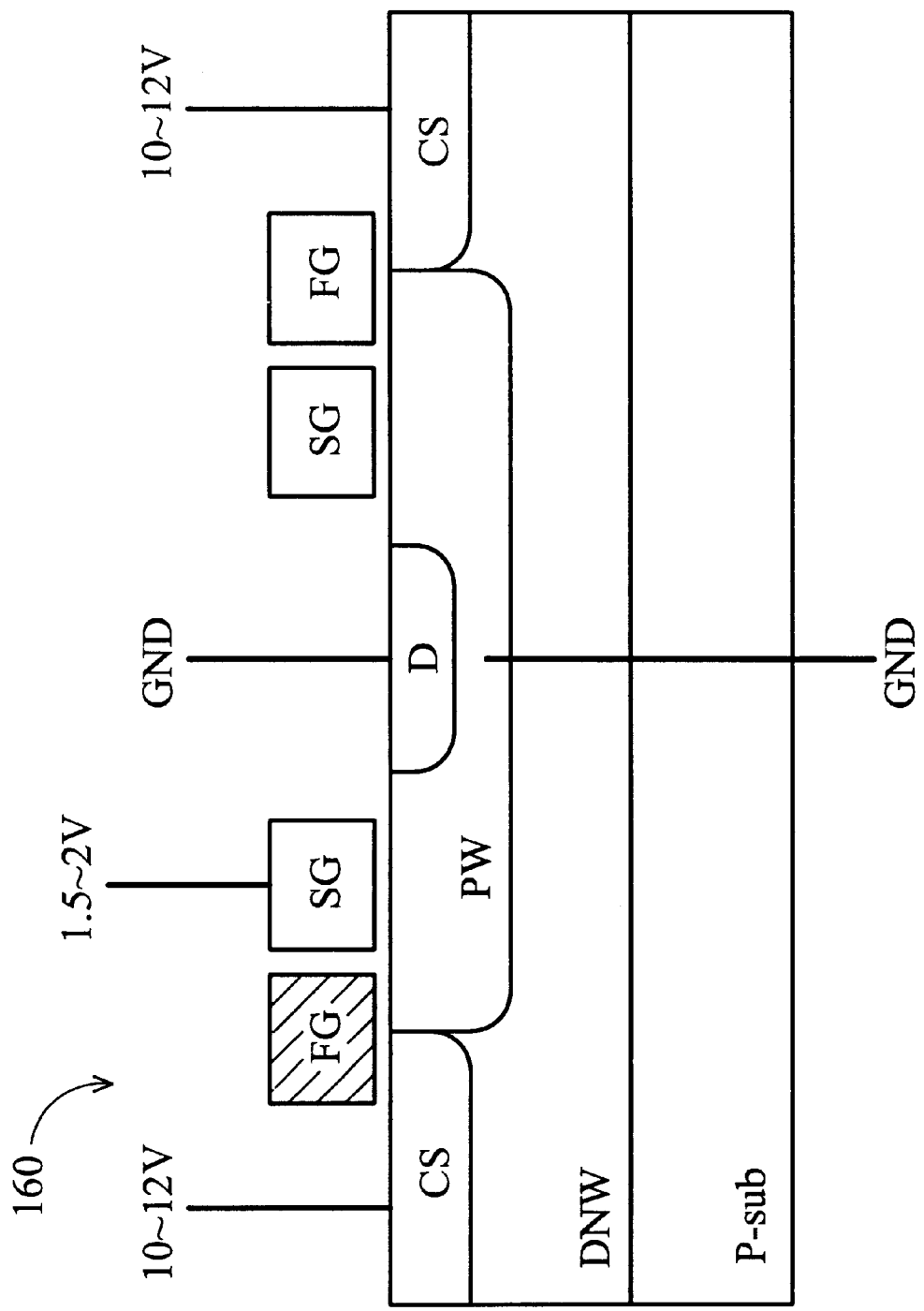
FIG. 10 shows a programming operation.
Figure 11:
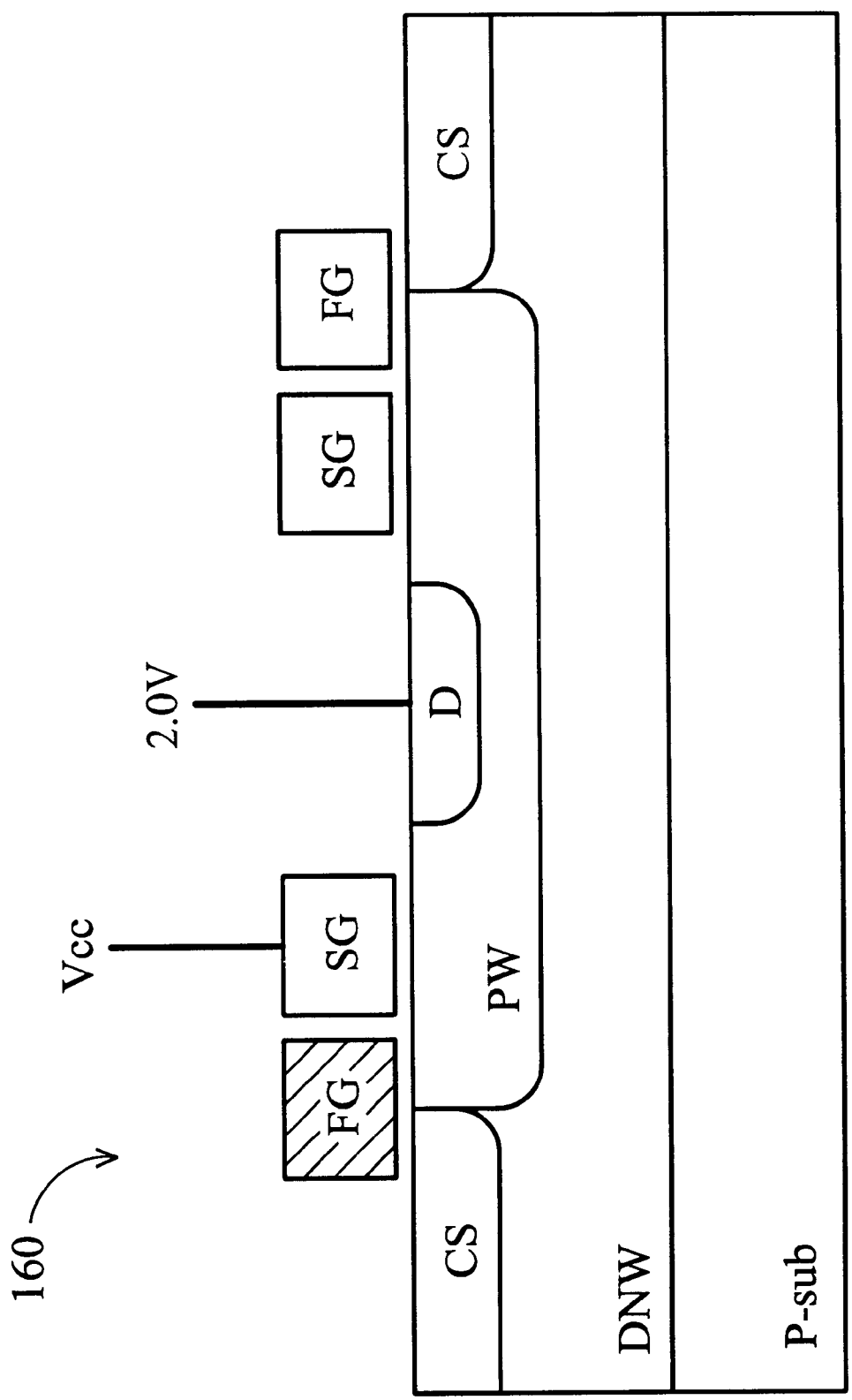
FIG. 11 shows a reading operation.

A description of operation methods for the single-poly EPROM is given below accompanying FIGS. 10 and 11. FIG. 10 shows a programming operation. FIG. 11 shows a reading operation.

FIG. 10 shows a cross section of a pair of memory cells and a condition for programming data to a selected memory cell. The detailed programming operation is listed in Table 1. A first positive voltage, such as SG≈1.5–2V, is applied to the selective gate SG, i.e. word line, of the selected memory cell 160. A second positive voltage higher than the first positive voltage is applied to the pair of sources CS, for example, CS≈10–12 V. As well, the sources CS are connected to each other by the deep n-well DNW, thus, all sources and the deep n-well are all in a high voltage state. An unselected bit line BL is floating. P-well PW and drain D, i.e. bit line BL, and the others are grounded. In this situation, charge carriers can be injected in to the floating gate FG of the memory cell 160, so the programming operation is performed by source side injection (SSI).

FIG. 11 shows a cross section of a pair of memory cells and a condition for reading data from a: selected memory cell. The detailed reading operation is listed in Table 1. A suitable positive voltage, such as SG =Vcc, is applied to the selected drain D, i.e. bit line. An unselected bit line BL is floating, and the others are grounded. In this situation, data in the memory cell 160 is read. If the memory cell 160 is in a programmed state, no current can be detected. If the memory cell 160 is unprogrammed, a current can be detected because the device is normally triggered (threshold voltage of the floating gate FG is −1v).

According to an erasing operation, UV light is used for overall erasing.

TABLE 1

|  | programming | Reading |
| --- | --- | --- |
| Selected word line | 1.5~2 V | Vcc |
| Unselected word line | GND | GND |
| Selected bit line | GND | 2.0 V |
| Unselected bit line | Floating | Floating |
| Selected PW | GND | GND |
| Unselected PW | GND | GND |
| Common source(DNW) | 10~12 V | GND |

As mentioned above, the fabrication method of the single-poly EPROM is compatible with traditional CMOS process. Thus, the method can be applied to form embedded devices. Moreover, SSI can be used to program in the single-poly EPROM of the present invention, and relatively higher performance can be reached. The structure also has the advantages of low power consumption and high speed programming (less than 5μs).

Furthermore, the single-poly EPROM has a smaller layout area, and the demand for increased memory density is attained.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of fabricating a pair of single-poly EPROM cells, compatible with CMOS process, comprising:

providing a substrate with an isolation region to define a striped active area;

forming a deep well of first conductive type located under the isolation region and the striped active area;

forming a gate oxide layer on the striped active area;

forming a conductive layer on the substrate having the gate oxide layer formed thereon;

defining the conductive layer to form a pair of floating gates and a pair of selective gates, with a gap between the pair of floating gates and the pair of selective gates, wherein the pair of selective gates are striped and perpendicular to the striped active area, and the pair of selective gates are disposed between the pair of floating gates;

forming a well of second conductive type in the deep well of first conductive type below the pair of selective gates and the pair of floating gates;

forming a pair of sources in the side walls of the well of second conductive type, the pair of sources connected to each other via the deep well of first conductive type; and forming a drain in the well of second conductive type between the pair of selective gates.

2. The method of claim 1, wherein the isolation region is a field oxide layer.

3. The method of claim 1, wherein the isolation region is a shallow trench isolation.

4. The method of claim 1, wherein the conductive layer is a polysilicon layer.

5. The method of claim 1, wherein the method of forming the pair of floating gates and the pair of selective gates comprises:

forming a mask layer on the conductive layer, the mask layer substantially having the pattern of the pair of floating gates and the pair of selective gates;

forming a plurality of spacers on the side walls of the mask layer, wherein the width of the gap between the pair of floating gates and the pair of selective gates is controlled by the spacers; and etching the conductive layer using the mask layer's spacers as an etching mask.

6. The method of claim 5, wherein the method of forming the well of second conductive type comprises:

forming a photoresist layer on the substrate on which the mask layer and the spacers are formed, the photoresist layer substantially having a pattern corresponding to the drain and being parallel to pair of selective gates;

implanting dopants of second conductive type in the deep well of first conductive type using the photoresist layer as a mask;

removing the photoresist layer;

thermally driving the dopants so as to form the striped well of second conductive type disposed under the pair of floating gates; and removing the mask layer and the spacers.

7. The method of claim 1, wherein the step of forming the sources further comprising forming a dielectric layer on the surface of the conductive layer to fill the gap between the pair of floating gates and the pair of selective gates.

* * * * *

UNITED STATES PATENT AND TRADEMARK OFFICE
CERTIFICATE OF CORRECTION

PATENT NO. : 6,653,183 B2
DATED : November 25, 2003
INVENTOR(S) : Chih-Wei Hung et al.

Figure 5A:
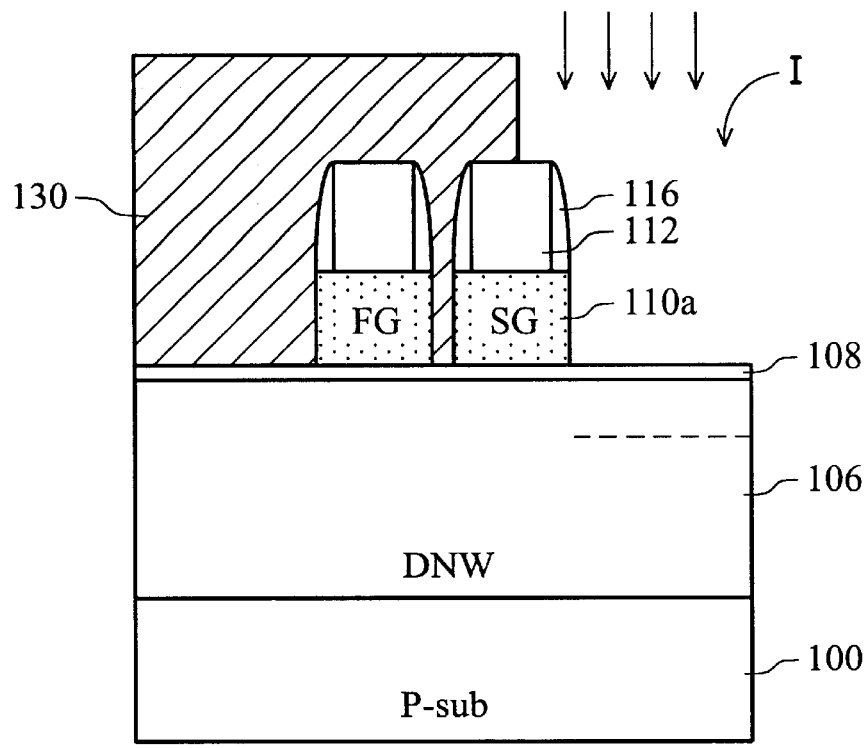
Figure 5B:
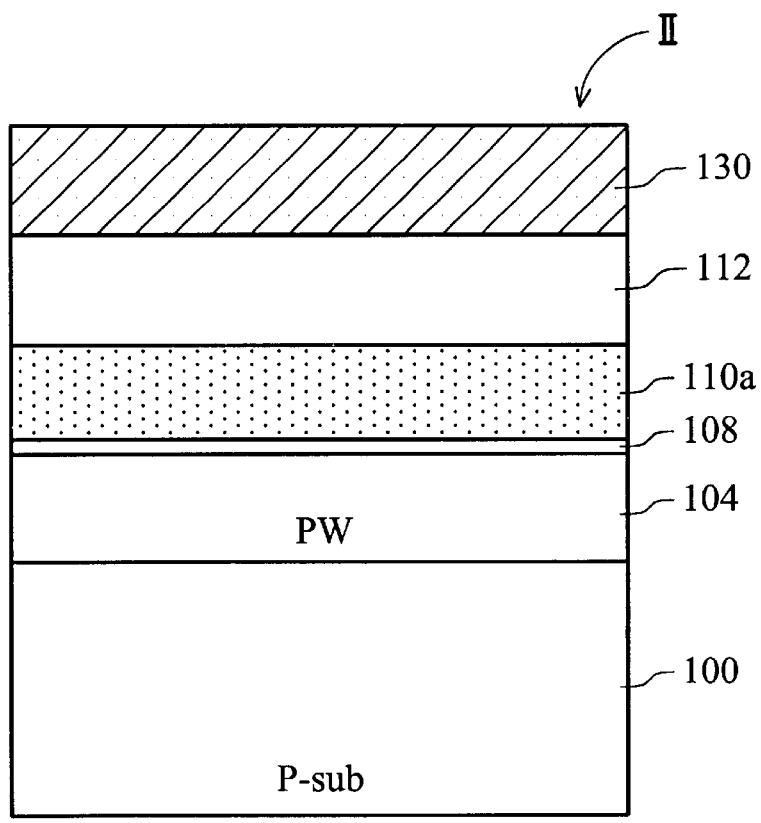
Figure 5C:
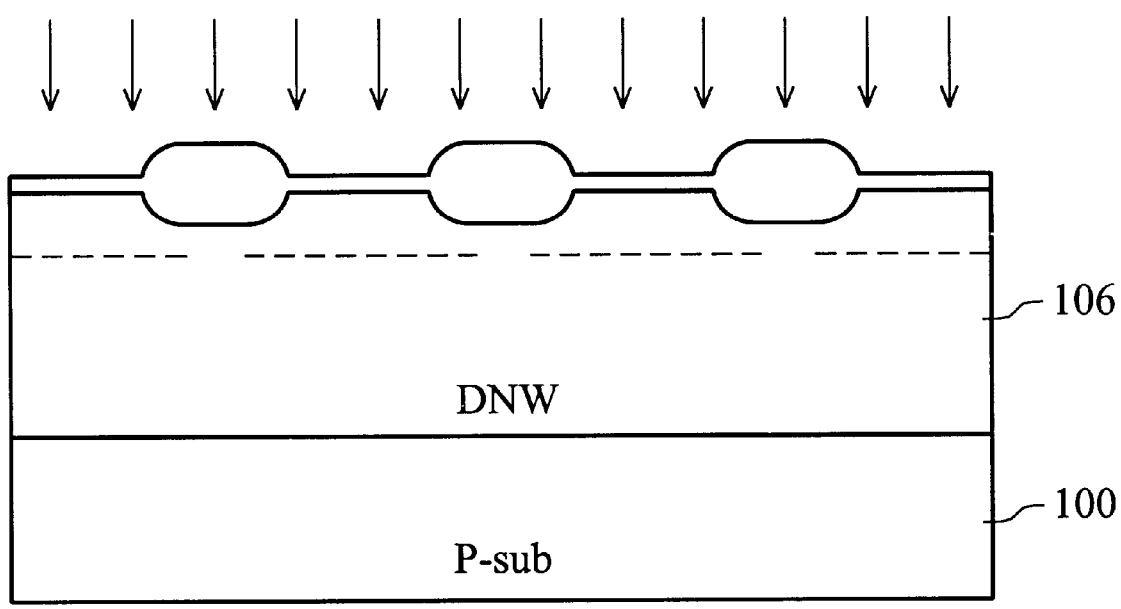
Figure 6A:
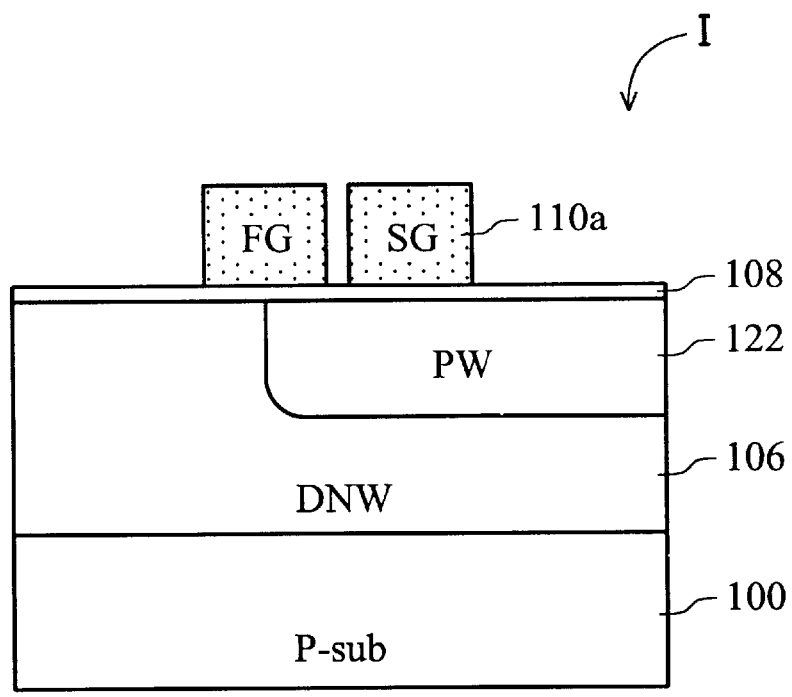
Figure 6B:
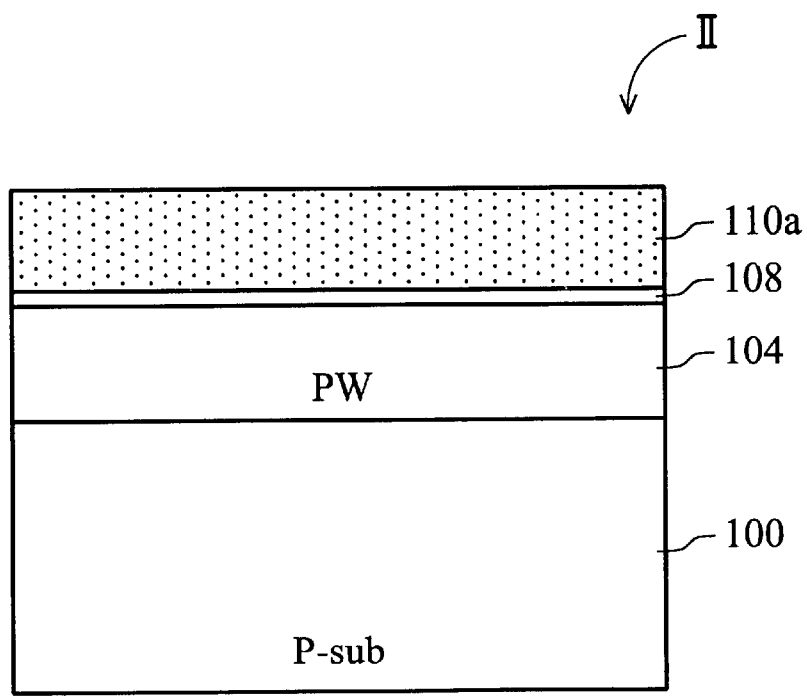

It is certified that error appears in the above-identified patent and that said Letters Patent is hereby corrected as shown below:

Column 3,
Line 21, change "FIG. 6C" to -- FIG. 5C --

Column 4,
Line 21, change "FIG. 6C" to -- FIG. 5C --

Signed and Sealed this

Fifth Day of July, 2005

JON W. DUDAS
*Director of the United States Patent and Trademark Office*